United States Patent
Herbrig et al.

(10) Patent No.: US 10,605,857 B2
(45) Date of Patent: Mar. 31, 2020

(54) ANECHOIC CHAMBER FOR TESTING A DEVICE UNDER TEST

(71) Applicant: Rohde & Schwarz GmbH & Co. KG, Munich (DE)

(72) Inventors: Markus Herbrig, Grafing (DE); Daniel Markert, Deggendorf (DE); Corbett Rowell, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 324 days.

(21) Appl. No.: 15/603,988

(22) Filed: May 24, 2017

(65) Prior Publication Data

US 2018/0340975 A1 Nov. 29, 2018

(51) Int. Cl.
 *G01R 31/28* (2006.01)
 *G01R 29/10* (2006.01)
 *G01R 29/08* (2006.01)
 *G01R 31/00* (2006.01)

(52) U.S. Cl.
 CPC ..... *G01R 31/2881* (2013.01); *G01R 29/0821* (2013.01); *G01R 29/105* (2013.01); *G01R 31/002* (2013.01)

(58) Field of Classification Search
 CPC .............. G01R 31/2881; G01R 31/286; G01R 31/2872; G01R 29/0821; G01R 31/2889; G01R 1/18; G01R 1/0466; G01R 31/2808; G01R 31/2886
 USPC ............. 324/750.14, 750.26, 750.27, 756.01
 See application file for complete search history.

(56) References Cited

U.S. PATENT DOCUMENTS

| | | | | |
|---|---|---|---|---|
| 4,075,550 A | * | 2/1978 | Castleman | G01N 27/66 250/382 |
| 4,684,807 A | * | 8/1987 | Wells | G01N 27/66 250/379 |
| 5,134,405 A | * | 7/1992 | Ishihara | G01R 29/105 342/1 |
| 5,833,365 A | * | 11/1998 | Stals | G01R 19/32 374/5 |
| 6,194,907 B1 | * | 2/2001 | Kanao | G01R 31/2886 324/627 |
| 7,151,442 B1 | * | 12/2006 | Nguyen | G07C 9/00111 340/428 |
| 2001/0024129 A1 | * | 9/2001 | Akram | G01R 1/0408 324/750.25 |
| 2002/0160717 A1 | * | 10/2002 | Persson | G01R 29/0821 455/67.11 |
| 2003/0085721 A1 | * | 5/2003 | Eldridge | G01R 1/07342 324/750.03 |
| 2010/0212292 A1 | * | 8/2010 | Rusch | F01N 3/2066 60/274 |
| 2011/0155897 A1 | * | 6/2011 | Harrison | H01J 37/08 250/251 |

(Continued)

*Primary Examiner* — Tung X Nguyen
*Assistant Examiner* — Robert P Alejnikov, Jr.
(74) *Attorney, Agent, or Firm* — Potomac Technology Law, LLC

(57) ABSTRACT

An anechoic chamber for testing a device under test is provided. The anechoic chamber comprises at least one gas input means for inputting a gas into the anechoic chamber, and at least one gas output means for outputting the gas out of the chamber. In addition to this, the gas input means and the gas output means create a directed gas stream with respect to a predefined region of the anechoic chamber.

18 Claims, 3 Drawing Sheets

(56) References Cited

U.S. PATENT DOCUMENTS

2014/0294038 A1* 10/2014 Nakamura ............ G01N 25/72
374/31
2015/0369853 A1* 12/2015 Chen ...................... H01Q 1/362
324/415

* cited by examiner

ANECHOIC CHAMBER FOR TESTING A DEVICE UNDER TEST

TECHNICAL FIELD

The invention relates to an anechoic chamber, more specifically, an anechoic chamber for testing a device under test.

BACKGROUND

Generally, in times of an increasing number of electronic devices, there is a growing need of an anechoic chamber for testing such devices without various interferences from the environment. In addition to this, due to the fact that many of these electronic devices have to sustain several ambient conditions such as gases entering the devices (e.g., humid air), and high or low operation temperatures, the anechoic chamber should especially allow for testing the electronic devices also with respect to such environmental conditions.

U.S. Pat. No. 5,134,405 relates to an electromagnetically anechoic chamber for electromagnetic compatibility testing of electronic devices. Disadvantageously, the described electromagnetically anechoic chamber does not provide the possibility of inputting a gas into the chamber in order to test the device under test with special respect to the above-mentioned ambient conditions.

Accordingly, there is a need for an anechoic chamber that allows for testing a device under test, for example, with respect to environmental conditions that the device may be exposed to, such as gases and varying temperature conditions.

SOME EXAMPLE EMBODIMENTS

Embodiments of the present invention advantageously address the foregoing requirements and needs, as well as others, by providing an anechoic chamber that allows for testing a device under test, for example, with respect to environmental conditions that the device may be exposed to, such as gases and varying temperature conditions.

According to a first aspect of the invention, an anechoic chamber for testing a device under test is provided. The anechoic chamber comprises at least one gas inputting means for inputting a gas into the anechoic chamber, and at least one gas outputting means for outputting the gas out of the chamber. The gas inputting means and the gas outputting means create a directed gas stream with respect to a predefined region of the anechoic chamber.

According to an example implementation form of the first aspect, the anechoic chamber comprises at least one absorber, at least one measurement antenna, a positioner or a holder for the device under test, wherein the device under test is arranged in the predefined region of the anechoic chamber. Advantageously, the device under test can be tested with respect to different environmental conditions simulated with the aid of the directed gas stream entering the device under test.

According to a further example implementation form of the first aspect, the anechoic chamber has a pressure difference between the gas inputting means and the gas outputting means.

According to a further example implementation form of the first aspect, the predefined region of the anechoic chamber comprises guiding means for guiding the directed gas stream. Advantageously, the directed gas stream enters the device under test in a most accurate and efficient manner.

According to a further example implementation form of the first aspect, the directed gas stream comprises gas with variable temperatures. Advantageously, environmental conditions with respect to the operation temperature of the device under test or parts of the device under test can be simulated with the aid of the gas with variable temperatures.

According to a further example implementation form of the first aspect, at least one of the dimensions of the predefined region is not less than a diameter of a device under test comprised by the anechoic chamber. Advantageously, the whole device under test is tested with respect to environmental conditions.

According to a further example implementation form of the first aspect, a surface in direction inside the anechoic chamber of at least one of the gas inputting means or the gas outputting means comprises electromagnetic absorbing material, electromagnetic neutral material, or a combination thereof. Advantageously, the gas inputting means and/or the gas outputting means do not influence the testing of the device under test with respect to electromagnetic tests and measurements.

According to a further example implementation form of the first aspect, the at least one gas inputting means and/or the at least one gas outputting means comprises at least one electromagnetic trapping structure.

According to a further example implementation form of the first aspect, the at least one electromagnetic trapping structure is formed on the basis of electromagnetic reflective material, electromagnetic absorbing material, electromagnetic neutral material, or a combination thereof.

According to a further example implementation form of the first aspect, the gas inputting means are shaped in form of a nozzle. Advantageously, the directed gas stream can be focused with the aid of the nozzle.

According to a further example implementation form of the first aspect, the gas outputting means are shaped in form of a funnel. Advantageously, inputted gas can be vacuumed off from the anechoic chamber in a most efficient manner.

According to a further example implementation form of the first aspect, the directed gas stream is steerable. Advantageously, the directed gas stream can focused on different parts of device under test without changing the position of the device under test.

According to a further example implementation form of the first aspect, the directed gas stream comprises nitrogen or oxygen or sulfur hexafluoride or helium or neon or argon or krypton or xenon or radon or air, or any combination thereof.

According to a further example implementation form of the first aspect, the position or an angle of at least one of the gas inputting means or the gas outputting means is variable. Advantageously, the directed gas stream can focused on different parts of device under test without changing the position of the device under test. Additionally, devices under test of different sizes can advantageously be investigated.

According to a further example implementation form of the first aspect, the position or an angle of a device under test comprised by the anechoic chamber is variable. Advantageously, every region or part of the device under test can be tested with special respect to ambient conditions.

According to a further example implementation form of the first aspect, the position or an angle of the guiding means is variable. Advantageously, every region or part of the device under test can be tested with special respect to environmental conditions.

According to a further example implementation form of the first aspect, the anechoic chamber comprises the device under test and a memory, wherein the memory saves specific position values or angle values of at least one of the gas inputting means or the gas outputting means with respect to the specific device under test inserted into the anechoic chamber. Advantageously, the test setup can automatically be adjusted according to the specific device under test.

According to a further example implementation form of the first aspect, the anechoic chamber comprises the device under test and a memory, wherein the memory saves specific position values or angle values of the guiding means with respect to the specific device under test inserted into the anechoic chamber. Advantageously, the test setup can automatically be adjusted according to the specific device under test.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings, in which like reference numerals refer to similar elements, and in which.

DETAILED DESCRIPTION

An anechoic chamber that allows for testing a device under test, for example, with respect to environmental conditions that the device may be exposed to, such as gases and varying temperature conditions, is described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

Figure 1:
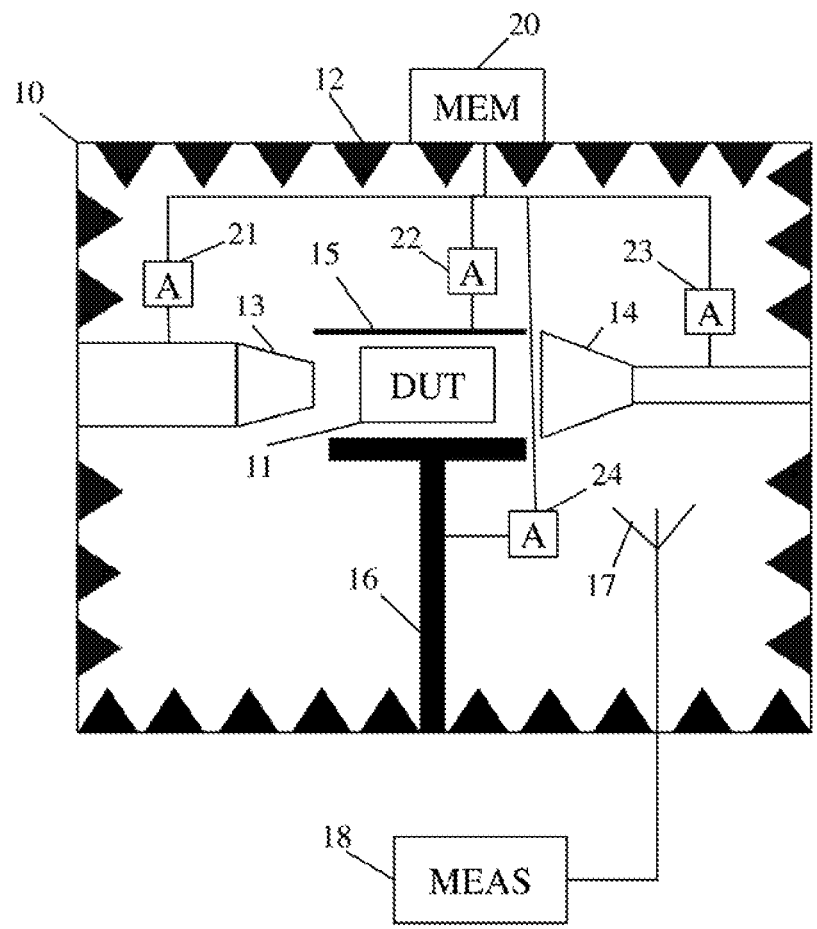
FIG. 1 shows an example anechoic chamber for testing a device under test, in accordance with example embodiments of the present invention.

FIG. 1 shows an example anechoic chamber 10 for testing a device under test 11, in accordance with example embodiments of the present invention.

The anechoic chamber 10 comprises absorbers 12 in order to avoid reflections with respect to electromagnetic measurements performed with the aid of an antenna 17 being connected to a measuring device 18. Whereas the antenna 17 is inside the anechoic chamber 10, the measuring device 18 is outside the anechoic chamber 10. Alternatively, the measuring device 18 may be also arranged inside the anechoic chamber 10.

Further, the device under test 11 is held inside the anechoic chamber 10 with the aid of a holder 16 which will be shown in greater detail later according to FIG. 3. In addition to this, an actuator 24 is coupled to the holder 16 in a manner that the position or an angle of the device under test 11 is variable.

Moreover, the anechoic chamber 10 comprises gas inputting means 13, for example, shaped in form of a nozzle, for inputting a gas into the anechoic chamber 10. Additionally, an actuator 21 is coupled to the gas inputting means 13 in a manner that the position or an angle of the gas inputting means 13 is variable.

In addition to this, the anechoic chamber 10 comprises gas outputting means 14, for example, shaped in form of a funnel, for outputting the gas out of the chamber 10. Additionally, an actuator 23 is coupled to the gas outputting means 14 in a manner that the position or an angle of the gas outputting means 14 is variable.

The gas inputting means 13 and the gas outputting means 14 create a directed gas stream with respect to a predefined region of the anechoic chamber 10, wherein the device under test 11 is especially arranged in the predefined region of the chamber 10. Additionally, the anechoic chamber 10 may include a pressure difference between the gas inputting means 13 and the gas outputting means 14.

In this context, the predefined region of the anechoic chamber 10 comprises guiding means 15 for guiding the directed gas stream. Additionally, an actuator 22 is coupled to the guiding means 15 in a manner that the position or an angle of the guiding means 15 is variable. In addition to this, as it can be seen, at least one of the dimensions, especially the diameter, of the predefined region is not less than a diameter of the device under test 11.

Further, with respect to the directed gas stream created with the aid of the gas inputting means 13 and the gas outputting means 14, it should be mentioned that the directed gas stream may especially comprise gas with variable temperatures in order to simulate different operation temperatures of the device under test 11. In addition to this, the directed gas stream may be steerable in order to simulate different temperatures of specific regions or parts of the device under test 11. Additionally or alternatively, the directed gas stream may comprise at least one of the following gases: nitrogen, oxygen, sulfur hexafluoride, helium, neon, argon, krypton, xenon, radon, air, humid air (e.g., with a humidity of 10% to 40%, with a humidity of 40% to 60%, with a humidity of 60% to 80%, with a humidity of 80% to 90%, or with a humidity of 90% to 100%).

Moreover, with respect to the gas inputting means 13 and the gas outputting means 14, at least one of the gas inputting means 13 and the gas outputting means 14 may comprise electromagnetic absorbing material, electromagnetic neutral material, or a combination thereof. In this context, these materials are comprised by a surface in direction inside the anechoic chamber 10 of at least one of the gas inputting means 13 and the gas outputting means 14. Additionally or alternatively, at least one of the gas inputting means 13 and the gas outputting means 14 may comprise at least one electromagnetic trapping structure. In addition to this, the at least one electromagnetic trapping structure may be formed on the basis of electromagnetic reflective material, electromagnetic absorbing material, electromagnetic neutral material, or a combination thereof.

As it can also be seen from FIG. 1, the anechoic chamber 10 comprises a memory 20, to which each of the above-mentioned actuators 21, 22, 23, 24 is connected. In this context, with respect to the specific device under test 11, the memory 20 saves specific positon values or angle values of the gas inputting means 13, the guiding means 15, the gas outputting means 14, and the holder 16, each of which is coupled to its corresponding actuator 21, 22, 23, 24. In this manner, the test setup can automatically be adjusted according to the specific device under test 11.

Figure 2:
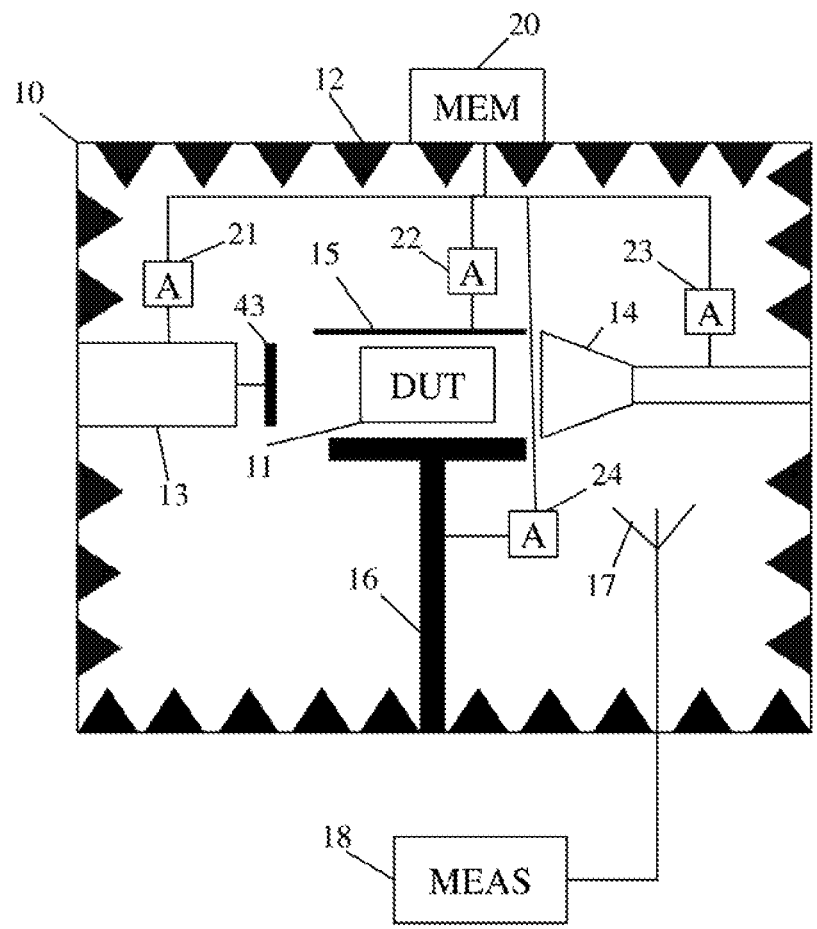
FIG. 2 shows a further example an anechoic chamber for testing a device under test, in accordance with example embodiments of the present invention.

FIG. 2 shows a further example an anechoic chamber 10 for testing a device under test 11, in accordance with example embodiments of the present invention. The an anechoic chamber 10 of FIG. 2 differs from the anechoic chamber 10 of FIG. 1 solely in that the nozzle of the gas inputting means 13 has been replaced by a propeller 43.

In this context, it is advantageous if the speed of the rotating propeller 43 is controlled in a manner that, in the case of a time slot based transmission scheme such as time division multiple access (TDMA), the device under test 11 (e.g., at least one antenna of the device under test, and/or a region of the at least one antenna of the device under test) is not covered by the propeller 43, while data is exchanged with the device under test 11.

Figure 3:
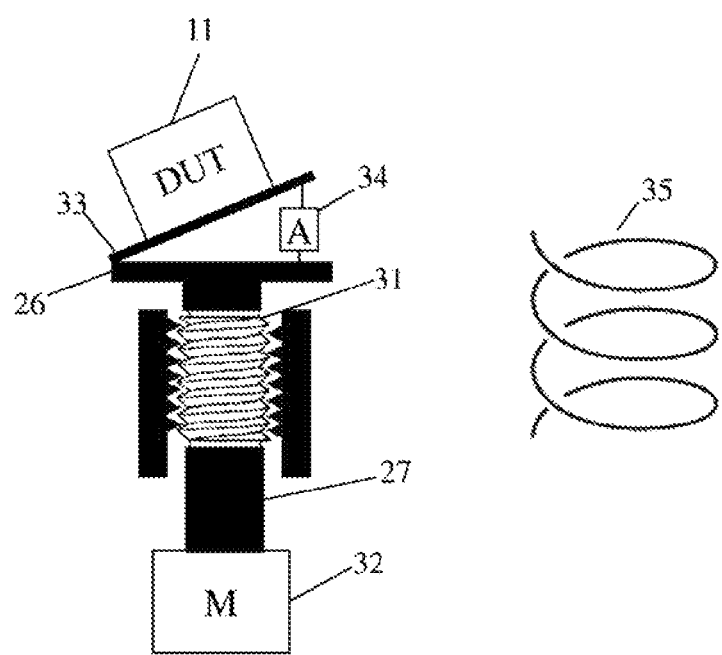
FIG. 3 shows an example holder that may be used to hold a device under test in an anechoic chamber for testing the device under test, in accordance with example embodiments of the present invention.

FIG. 3 shows an example holder 16 that may be used to hold a device under test 11 in an anechoic chamber 10 for testing the device under test, in accordance with example embodiments of the present invention. In this context, the device under test holder 16 comprises a first planar surface 26 attached to a first end of an axis 27, wherein the axis 27 comprises a thread 31 for moving the first planar surface 26 up and down with the aid of a motor 32 attached to a second end of the axis 27. As it can be seen, rotating the axis 27 with the aid of the motor 32 serves the height adjustment of the first planar surface 26, and thus also of the device under test 11.

Further, the device under test 11 is attached to a second planar surface 33 that is attached to the first planar surface 26 in a manner whereby the second planar surface 33 may be tilted at different angles with respect to the first planar surface 26. For the purpose of tilting the device under test 11, and thus for tilting the second planar surface 33 with respect to the first planar surface 26, the device under test mount comprises an actuator 34 that tilts the second planar surface 33 with respect to the first planar surface 26.

In addition to this, FIG. 3 illustrates an example trace 35 of movement of the device under test 11 in the case that the device under test 11 is moved down in a tilted condition, which leads to the helical trace 35.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An anechoic chamber for testing a device under test comprising:
    at least one gas input valve for inputting a gas into the anechoic chamber; and
    at least one gas output valve for outputting the gas out of the chamber; and
    wherein the gas input valve and the gas output valve create a directed gas stream with respect to a predefined region of the anechoic chamber, and
    wherein the at least one gas input valve comprises a propeller, wherein a speed at which the propeller rotates is controlled in a manner that the device under test is not covered by the propeller while data is exchanged with the device under test via a time slot based transmission scheme.

2. The anechoic chamber according to claim 1, further comprising:
    at least one absorber;
    at least one measurement antenna; and
    a holder for the device under test, wherein the holder is configured to position the device under test at least partially within the predefined region of the anechoic chamber.

3. The anechoic chamber according to claim 1, wherein the anechoic chamber has a pressure difference between the gas input valve and the gas output valve.

4. The anechoic chamber according to claim 1, further comprising:
    a guide configured to guide the directed gas stream.

5. The anechoic chamber according to claim 4, wherein a position of the guide is variable.

6. The anechoic chamber according to claim 4, further comprising:
    a memory configured to store position values of the guide with respect to the device under test within the anechoic chamber.

7. The anechoic chamber according to claim 1, wherein the directed gas stream comprises gas with variable temperatures.

8. The anechoic chamber according to claim 1, wherein at least one dimension of the predefined region is not less than a corresponding dimension of the device under test.

9. The anechoic chamber according to claim 1, wherein a surface of one or more of the gas input valve and the gas output valve, in a direction inside the anechoic chamber, comprises one or more of an electromagnetic absorbing material and an electromagnetic neutral material.

10. The anechoic chamber according to claim 1, wherein one or more of the gas input valve and the gas output valve comprises at least one electromagnetic trapping structure.

11. The anechoic chamber according to claim 10, wherein the at least one electromagnetic trapping structure, of the one or more of the gas input valve and the gas output valve, is formed based on one or more of an electromagnetic reflective material, an electromagnetic absorbing material, and an electromagnetic neutral material.

12. The anechoic chamber according to claim 1, wherein the gas input valve is shaped in a nozzle form.

13. The anechoic chamber according to claim 1, wherein the gas output valve is shaped in a funnel form.

14. The anechoic chamber according to claim 1, wherein the directed gas stream is steerable.

15. The anechoic chamber according to claim 1, wherein the directed gas stream comprises one or more of nitrogen, oxygen, sulfur hexafluoride, helium, neon, argon, krypton, xenon, radon, and air.

16. The anechoic chamber according to claim 1, wherein a position of one or more of the gas input valve and the gas output valve is variable.

17. The anechoic chamber according to claim 1, wherein a position of the device under test within the anechoic chamber is variable.

18. The anechoic chamber according to claim 1, further comprising:
- a memory configured to store position values of one or more of the gas input valve and the gas output valve with respect to the device under test within the anechoic chamber.

\* \* \* \* \*